United States Patent
Jung

(10) Patent No.: US 11,026,341 B2
(45) Date of Patent: Jun. 1, 2021

(54) METHOD OF CHANGING A SWITCHING MODULE USING PRESSURE-APPLYING DEVICE

(71) Applicant: LSIS CO., LTD., Anyang-si (KR)

(72) Inventor: Teagsun Jung, Anyang-si (KR)

(73) Assignee: LSIS CO., LTD., Anyang-si (KR)

( * ) Notice: Subject to any disclaimer, the term of this patent is extended or adjusted under 35 U.S.C. 154(b) by 205 days.

(21) Appl. No.: 16/279,451

(22) Filed: Feb. 19, 2019

(65) Prior Publication Data

US 2019/0307011 A1 Oct. 3, 2019

(30) Foreign Application Priority Data

Mar. 30, 2018 (KR) .......................... 10-2018-0037096

(51) Int. Cl.
| | | |
|---|---|---|
| *H05K 7/12* | (2006.01) | |
| *H01L 29/74* | (2006.01) | |
| *H02J 3/18* | (2006.01) | |
| *H05K 7/20* | (2006.01) | |
| *H01L 23/40* | (2006.01) | |
| *H01L 21/50* | (2006.01) | |
| *H05K 7/14* | (2006.01) | |
| *H01L 25/00* | (2006.01) | |
| *H01L 25/11* | (2006.01) | |

(52) U.S. Cl.
CPC .............. *H05K 7/12* (2013.01); *H01L 21/50* (2013.01); *H01L 23/4012* (2013.01); *H01L 25/00* (2013.01); *H01L 29/7408* (2013.01); *H02J 3/1807* (2013.01); *H05K 7/1432* (2013.01); *H05K 7/20927* (2013.01); *H01L 25/117* (2013.01)

(58) Field of Classification Search
CPC ..... H01L 21/50; H01L 23/4012; H01L 25/00; H01L 25/117; H01L 29/7408; H02J 3/1807; H05K 7/12; H05K 7/1432
See application file for complete search history.

(56) References Cited

U.S. PATENT DOCUMENTS

2014/0231869 A1   8/2014   Raubo et al.

FOREIGN PATENT DOCUMENTS

| CN | 101950724 A | * | 1/2011 |
|---|---|---|---|
| CN | 107186659 A | * | 9/2017 |
| CN | 208293444 U | * | 12/2018 |
| CN | 208293444 U |   | 12/2018 |

(Continued)

OTHER PUBLICATIONS

Korean Office Action for related Korean Application No. 10-2018-0037096; action dated Jun. 14, 2019; (25 pages).

(Continued)

*Primary Examiner* — Carl J Arbes
(74) *Attorney, Agent, or Firm* — K&L Gates LLP

(57) ABSTRACT

A switching module may include a plurality of cooling plates stacked along a vertical direction, a switch disposed between the cooling plates, a first supporting member disposed below the lowermost cooling plate, a second supporting member disposed above the uppermost cooling plate, first and second pressing support portions disposed between the lowermost cooling plate and the first supporting member, and a pressing member disposed between the uppermost cooling plate and the second supporting member.

4 Claims, 12 Drawing Sheets

(56) References Cited

FOREIGN PATENT DOCUMENTS

| | | |
|---|---|---|
| CN | 107186659 A | 9/2019 |
| JP | 58112353 A  * | 7/1983 |
| JP | S58112353 A | 7/1983 |
| JP | H106343267 A | 12/1994 |
| JP | H108162609 A | 6/1996 |
| JP | H108308214 A | 11/1996 |
| JP | H109131061 A | 5/1997 |
| JP | H111178317 A | 7/1999 |
| JP | 2002044965 A | 2/2002 |
| JP | 2011211771 A | 10/2011 |
| JP | 2016034003 A | 3/2016 |
| KR | 20100121522 A | 11/2010 |
| KR | 20140115185 A | 9/2014 |
| WO | 2016174695 A1 | 11/2016 |

OTHER PUBLICATIONS

Korean Notice of Allowance for related Korean Application No. 10-2018-0037096; action dated Aug. 20, 2019; (3 pages).

European Search Report for related European Application No. 19158127.1; action dated Aug. 13, 2019; (10 pages).

* cited by examiner

METHOD OF CHANGING A SWITCHING MODULE USING PRESSURE-APPLYING DEVICE

CROSS-REFERENCE TO RELATED APPLICATIONS

Pursuant to 35 U.S.C. § 119(a), this application claims the benefit of earlier filing date and right of priority to Korean Application No. 10-2018-0037096, filed on Mar. 30, 2018, which is herein expressly incorporated by reference in its entirety.

BACKGROUND OF THE INVENTION

1. Field of the Invention

The present disclosure relates to a pressing device of a switching module and a method of changing a switch in the switching module using the same.

2. Description of the Conventional Art

Due to the development of industry and the increase of the population, power demand is soaring, but power production is limited.

Accordingly, a power system for supplying power generated at a production site to a demand site stably without loss has become increasingly important.

There is a need for FACTS (Flexible AC Transmission System) facilities for power flow, system voltage, and stability improvement. The FACTS facilities include reactive power compensation apparatuses such as a SVC (Static Var Compensator) or a STATCOM (STATic synchronous COMpensator). These reactive power compensation apparatuses are connected in parallel to a power system to compensate for reactive power required in the power system.

The SVC may be configured by combining a Thyristor Controlled Reactor (TCR) that controls the phase of a reactor using a thyristor according to its application, a Thyristor Switched Capacitor (TSC) that switches a capacitor, a Fixed Capacitor Bank, and the like.

The SVC may include a thyristor valve connected to a transformer to control the voltage of the power system and a gate unit that controls the gate of the thyristor valve.

When a plurality of thyristors are connected in series to each other in the thyristor valve and conducted under the control of the gate unit, a high voltage or a high current flows through the thyristor. In addition, each thyristor is heavy and bulky, so it is not easy to handle.

Therefore, in order to construct a thyristor valve in an SVC as an assembly, many considerations such as the arrangement of the thyristor, the insulation of the thyristor, the heat dissipation of the thyristor, the weight of the thyristor, and the volume of the thyristor must be taken into account.

However, an optimal SVC-related switch assembly has not yet been developed to satisfy all of these requirements.

Moreover, when a switch is damaged in the switch assembly, any method of efficiently replacing the damaged switch has not be presented.

SUMMARY OF THE INVENTION

The present disclosure is provided to solve the foregoing and other problems.

Another object of the present disclosure is to provide a switch assembly of a reactive power compensation apparatus of a new structure.

Still another object of the present disclosure is to provide a switch assembly of a reactive power compensation apparatus having an optimal arrangement structure satisfying various requirements.

Yet still another object of the present disclosure is to provide a pressing device capable of easily separating between cooling plates adjacent to each other.

Still yet another object of the present disclosure is to provide a method of replacing a switch in a switching module capable of easily replacing a damaged switch.

In order to achieve the foregoing and other objects, according to an aspect of the present disclosure, there is provide a method of replacing a switch in a switching module including a plurality of cooling plates stacked along a vertical direction; a switch disposed between the cooling plates; a first supporting member disposed above the uppermost cooling plate; a second supporting member disposed below the lowermost cooling plate; first and second pressing support portions disposed between the lowermost cooling plate and the second supporting member, and a pressing member comprising a protruding region disposed between the uppermost cooling plate and the first supporting member and protruded on the first supporting member through the first supporting member, and the method may include pressing the first pressing support portion using a first pressing device to raise the first pressing support portion in an upward direction when a specific switch disposed between a first cooling plate and a second cooling plate above the first cooling plate among the plurality of cooling plates is damaged; removing the second pressing support portion; arranging a second pressing device around the specific switch between the first cooling plate and the second cooling plate; pressing the second cooling plate using the second pressing device to separate the second cooling plate from the specific switch; and removing the specific switch and inserting a new switch.

Here, said raising the first pressing support portion may include fixing the first pressing device to the first pressing support portion through the first supporting member and the second pressing support portion.

Furthermore, the second pressing device may include a first pressing portion and a second pressing portion, and the first pressing portion may be disposed between the first cooling plate and the second cooling plate on a first side of the specific switch, and the second pressing portion may be disposed between the first cooling plate and the second cooling plate on a second side of the specific switch.

Furthermore, the method may further include allowing at least two or more guide rods to pass through each of the cooling plates to fix the plurality of cooling plates prior to raising the first pressing support portion.

Furthermore, the method may further include fixing the protruding region of the pressing member using a clamp.

In addition, the method may further include removing pressure applied to the second cooling plate using the second pressing device when the new switch is inserted; removing the clamp from the protruding region; raising the first pressing support portion in an upward direction using the first pressing device; inserting the second pressing support portion between the first pressing support portion and the first supporting member; and removing the guide rods.

According to another aspect of the present disclosure, there is provided a pressing device for separating adjacent first and second cooling plates in a switching module comprising a plurality of cooling plates stacked along a vertical direction and a switch disposed between the cooling plates, and the pressing device may include a first pressing portion disposed between the first cooling plate and the second cooling plate on a first side of a specific switch; and a second pressing portion disposed between the first cooling plate and the second cooling plate on a second side of the specific switch.

Here, each of the first and second pressing portions may include a pressure supply portion configured to supply pressure; a support plate disposed below the pressure supply portion to be in contact with an upper surface of the first cooling plate; and a pressure transmission portion disposed above the pressure supply portion to be in contact with an upper surface of the second cooling plate and press the second cooling plate using the supplied pressure.

Furthermore, each of the first and second pressing portions may further include a pressure drive portion disposed between the pressure supply portion and the pressure transmission portion to drive the pressure transmission portion Furthermore, the pressure drive portion may move in a vertical direction by the supplied pressure.

Furthermore, the pressing device may further include a pressure generation portion connected to the first and second pressing portions to generate the pressure.

In addition, the pressure generation portion may include a knob.

The effects of the pressing device of the switching module and the method of replacing the switching module according to the embodiment of the present invention will be described as follows.

According to at least one of embodiments, a thyristor and a switch may be stacked in a vertical direction, thereby having an advantage capable of optimizing arrangement structure and minimizing the occupied area.

According to at least one of embodiments, a cooling plate through which cooling water flows on the upper and lower surfaces of the switch may be provided, thereby having an advantage of facilitating heat dissipation of the switch.

According to at least one of embodiments, the switch, the cooling plate, and the like may be modularized, thereby having an advantage of facilitating installation.

According to at least one of embodiments, the pressing device may be disposed between the first and second cooling plates disposed with the damaged switch therebetween to increase a gap between the first and second cooling plates by the pressing device, and then the damaged switch may be replaced with a new switch, thereby further facilitating switch replacement.

Further scope of applicability of the embodiments will become apparent from the detailed description given hereinafter. However, it should be understood that the detailed description and specific embodiments such as preferred embodiments are given by way of illustration only, since various changes and modifications within the spirit and scope of the embodiments will become apparent to those skilled in the art from this detailed description.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENT

Figure 1:
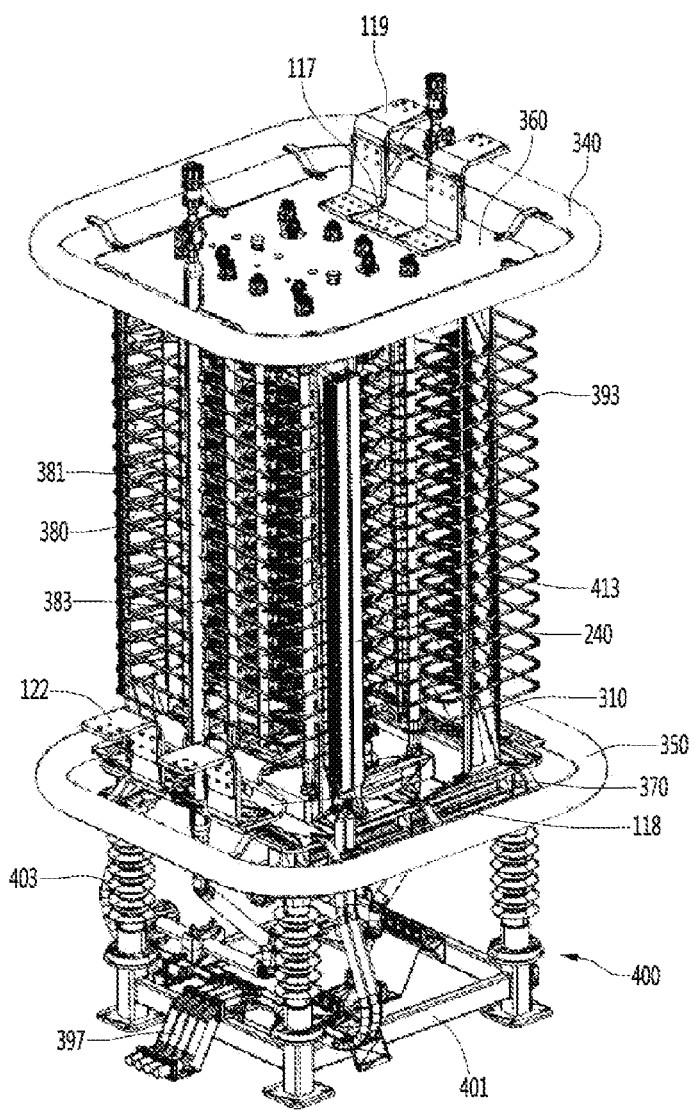
FIG. 1 is a perspective view illustrating a switch assembly of a reactive power compensation apparatus according to an embodiment.

Hereinafter, the embodiments disclosed herein will be described in detail with reference to the accompanying drawings, and the same or similar elements are designated with the same numeral references regardless of the numerals in the drawings and their redundant description will be omitted. A suffix "module" and "unit" used for constituent elements disclosed in the following description is merely intended for easy description of the specification, and the suffix itself does not give any special meaning or function. In describing the embodiments disclosed herein, moreover, the detailed description will be omitted when specific description for publicly known technologies to which the invention pertains is judged to obscure the gist of the present disclosure. Furthermore, it should be understood that the accompanying drawings are merely illustrated to easily understand an embodiment disclosed herein, and therefore, the technological concept disclosed herein is not limited by the accompanying drawings, and the concept of the present disclosure should be understand to include all modifications, equivalents, and substitutes included in the concept and technological scope of the embodiment.

Figure 2:
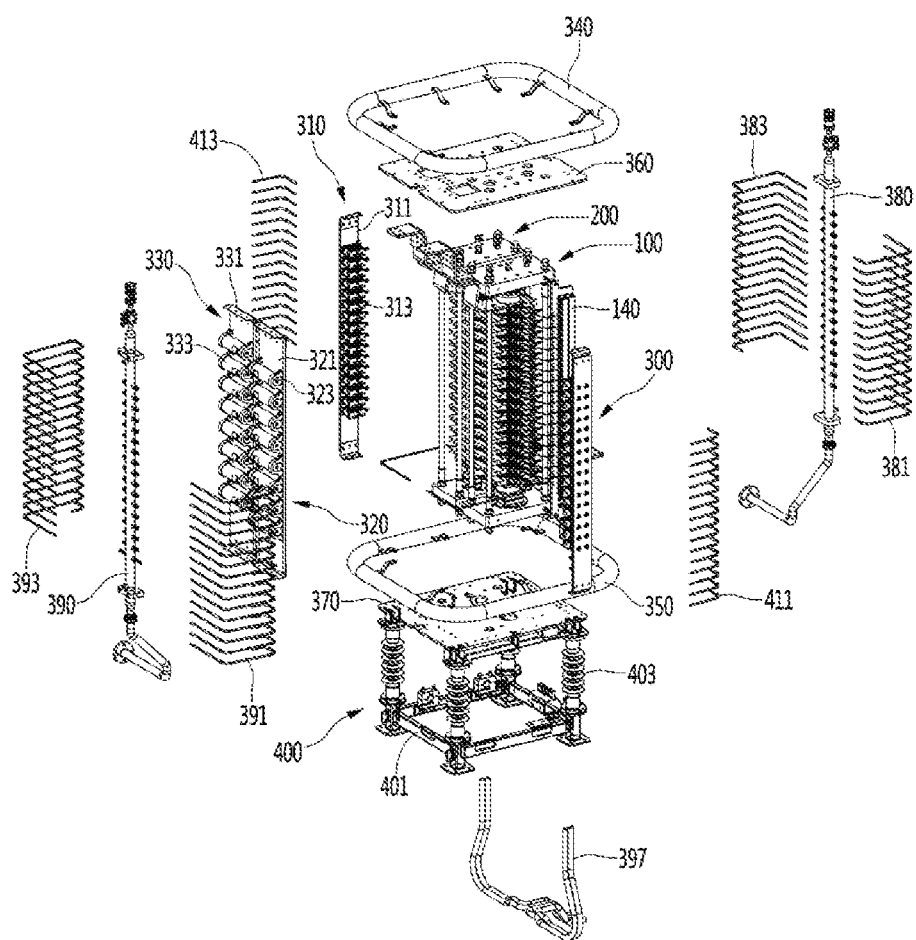
FIG. 2 is an exploded perspective view illustrating a switch assembly of a reactive power compensation apparatus according to an embodiment.
Figure 3:
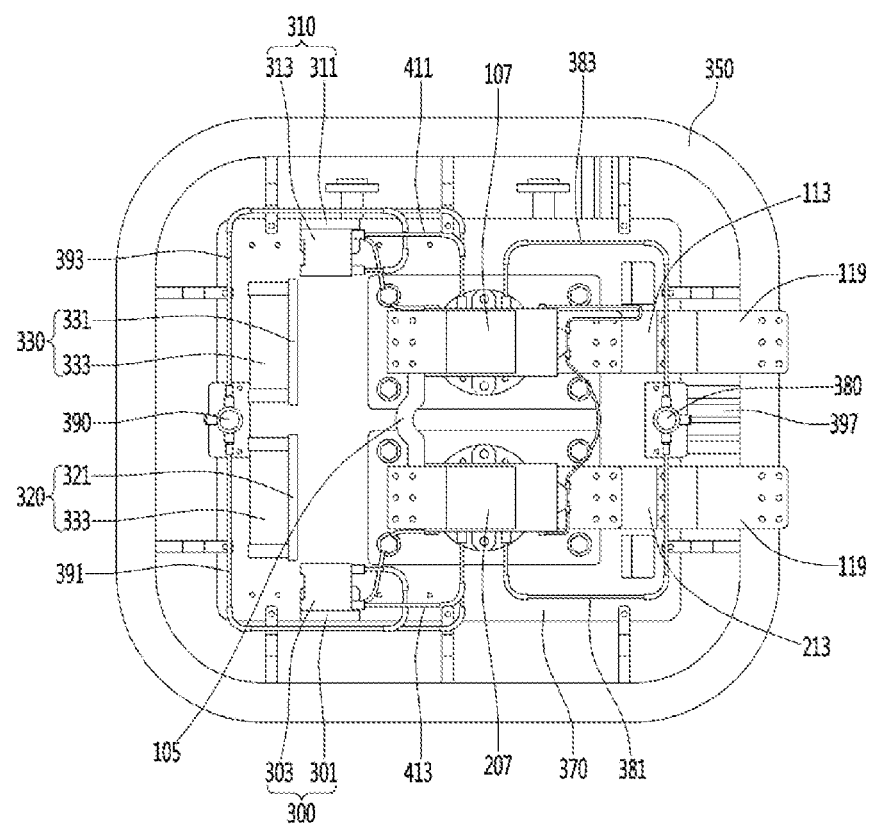
FIG. 3 is a plan view illustrating a switch assembly of a reactive power compensation apparatus according to an embodiment.

FIG. 1 is a perspective view illustrating a switch assembly of a reactive power compensation apparatus according to an embodiment, and FIG. 2 is an exploded perspective view illustrating a switch assembly of a reactive power compensation apparatus according to an embodiment, and FIG. 3 is a plan view illustrating a switch assembly of a reactive power compensation apparatus according to an embodiment. The reactive power compensating apparatus illustrated in FIGS. 1 through 3 illustrate a stationary reactive power compensating apparatus, for instance, but the embodiment is not limited thereto.

FIGS. 1 through 3 illustrate a single switch assembly, but a plurality of switch assemblies electrically connected to each other are also possible.

<Support Module>

A switch assembly of a reactive power compensation apparatus according to an embodiment may provide a support module 400.

The support module 400 may support all components constituting the reactive power compensation apparatus. The support module 400 may allow the components disposed thereon to be insulated from the earth.

The support module 400 may include a frame 401 including four columns and four connecting portions that connect these columns. The frame 401 may be made of a material having excellent insulation and excellent supporting strength. For instance, the frame 401 may be made of stainless steel or a steel beam.

For instance, the column may be provided with an insulating member 403 or the column itself may be the insulating member 403. The insulating member 403 may be an insulator. The insulator is an insulating body used for insulating and supporting an electric conductor, and hard porcelain may be used for the insulating body, for instance.

Though will be described later, the support module 400 may be provided with a fastening portion for fastening an optical cable 397 or a fastening portion for fastening first and second main pipes 380, 390. The optical cable 397 supplies a drive signal, for example, a gate signal, to a first switching module 100 or a second switching module 200, or supplies various signals measured from the first switching module 100 or the second switching module 200, for instance, a voltage signal, a current signal, a temperature signal, and the like, to a controller (not shown). The first and second main pipes 380, 390 supply cooling water to the first switching module 100 or the second switching module 200 to cool the first switching module 100 or the second switching module 200.

<First Switching Module 100>

Figure 4:
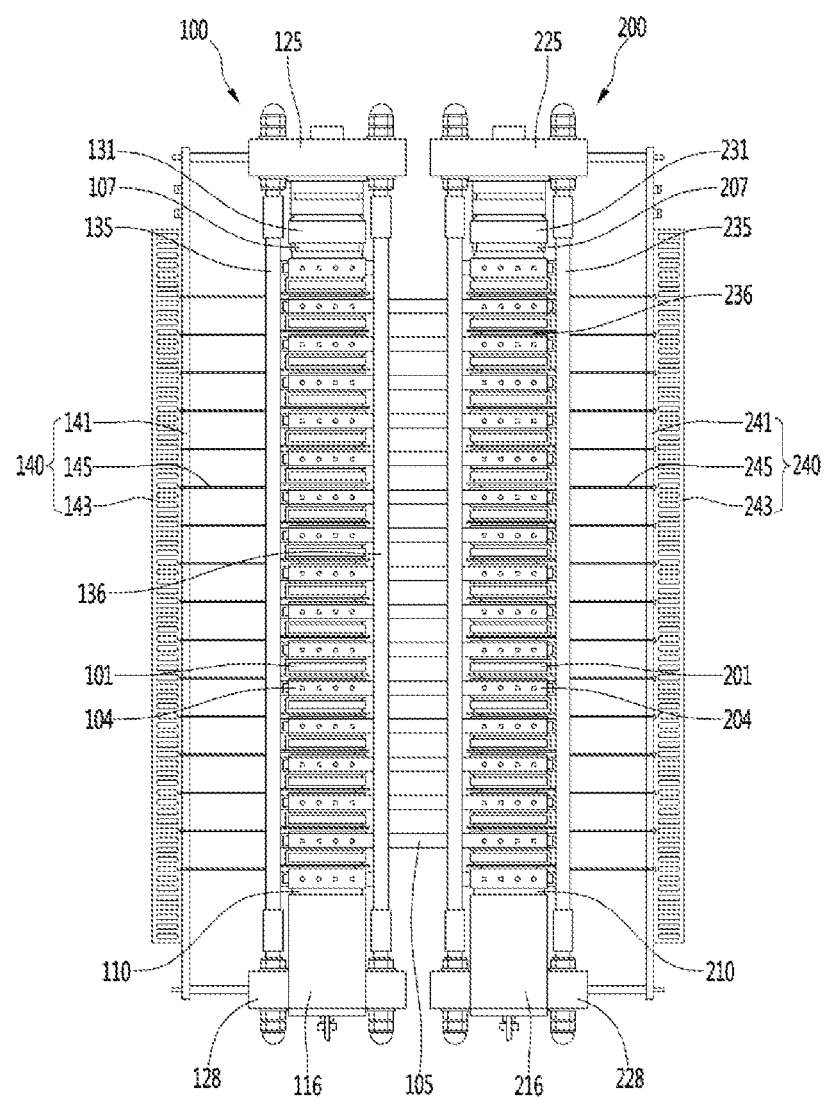
FIG. 4 is a front view illustrating a switching module according to an embodiment.

A switch assembly of a reactive power compensation apparatus according to an embodiment may include the first switching module 100. The first switching module 100 may have a first stack structure that is perpendicular to the support module 400. The first switching module 100 will be described in detail with reference to FIGS. 4 and 5. FIG. 4 is a front view illustrating a switching module according to an embodiment, and FIG. 5 is a perspective view illustrating a switching module according to an embodiment.

Figure 5:
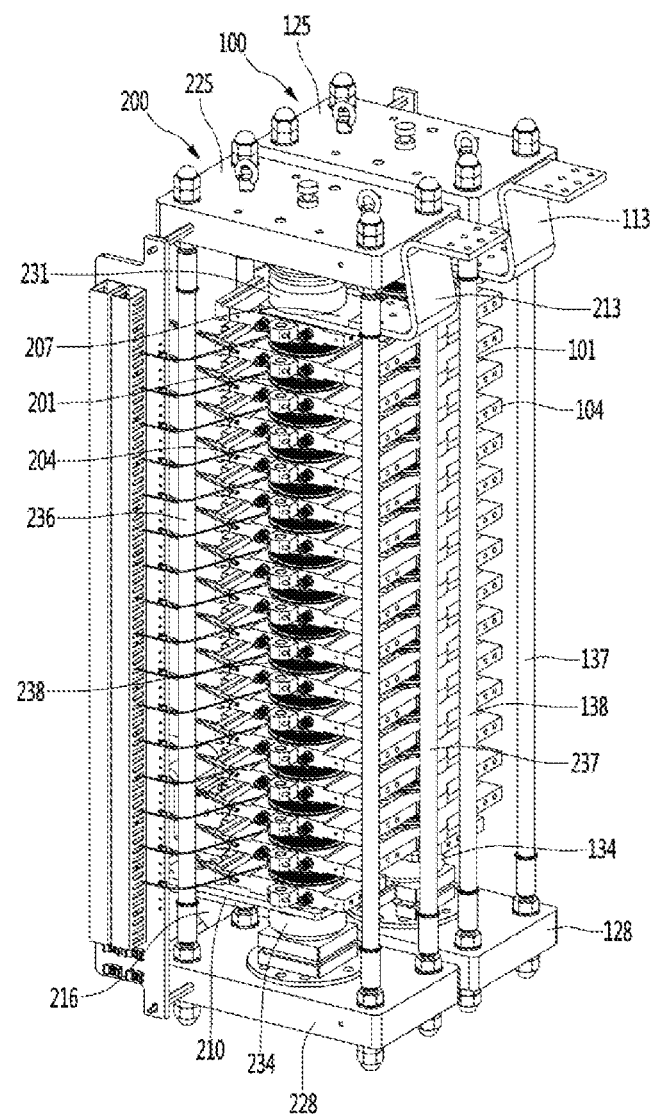
FIG. 5 is a perspective view illustrating a switching module according to an embodiment.

Referring to FIGS. 4 and 5, the first switching module 100 may be disposed on the support module 400. A second support plate 370 which will be described later is fastened to an upper surface of the support module 400, and both the first switching module 100 and the second switching module 200 may be fastened to the second support plate 370. A second support plate 370 may be disposed under the first switching module 100 and the second switching module 200. Moreover, a second support plate 360 may be disposed under the first switching module 100 and the second switching module 200. In this case, an upper side of each of the first and second switching modules 100, 200 may be fastened to the first support plate 360. Accordingly, the first and second switching modules 100, 200 may be disposed between the first support plate 360 and the second support plate 370.

The first switching module 100 may include a plurality of switches 101 stacked along a vertical direction with respect to the support module 400. The first switching module 100 may be a forward switching module in which a current flows from the second electrode plate 110 to the first electrode plate 107 in an upward direction, for instance, but the present disclosure is not limited thereto.

The plurality of switches 101 may be connected in series to each other. A first switch is provided, a second switch is disposed on the first switch, and a second switch is disposed on the second switch. In this manner, the plurality of switches 101 may be arranged on the support module 400.

The switch 101 may be formed in a circular shape when viewed from above, but the present disclosure is not limited thereto. The switch 101 includes a body, and a semiconductor device may be embedded in the body. The body may be made of insulating material. Each of the lower surface and the upper surface of the body may have a planar shape.

The switch 101 may be a semiconductor device, for instance, a thyristor. The switch 101 may include a gate, an anode, and a cathode. For instance, it is assumed that a first switch, a second switch, and a third switch are sequentially arranged on the support module 400. In this case, the cathode of the second switch may be electrically connected to the anode of the first switch, and the anode of the second switch may be electrically connected to the cathode of the third switch.

The first switching module 100 may include a plurality of cooling plates 104 stacked along a vertical direction with respect to the support module 400. The switch 101 may be disposed between the cooling plates 104. The switch 101 and the cooling plate 104 may be alternately stacked. For instance, the cooling plate 104 is provided, the switch 101 is disposed on the cooling plate 104, and the cooling plate 104 is disposed on the switch 101. The cooling plate 104 may be provided on the uppermost switch among the plurality of switches 101 and the cooling plate 104 may be provided below the undermost switch among the plurality of switches 101. In other words, when n switches 101 are provided therein, (n+1) cooling plates may be provided therein. In this case, the first switch is located on the first cooling plate, and the nth switch is located under the (n+1)th cooling plate.

The cooling plate 104 may have a rectangular shape, for instance, when viewed from above, but the present disclosure is not limited thereto. The size of the cooling plate 104 may be larger than that of the switch 101 at least. The switch 101 may be located at the center of the cooling plate 104, but the present disclosure is not limited thereto.

The cooling plate 104 and the switch 101 may be in surface contact. For instance, an upper surface of the first cooling plate may be in surface contact with a lower surface of the first switch. A lower surface of the second cooling plate is in surface contact with an upper surface of the first switch, and an upper surface of the second cooling plate is in surface contact with a lower surface of the second switch. A lower surface of the third cooling plate may be in surface contact with an upper surface of the second switch.

As described above, the lower surface and the upper surface of the switch 101 may be brought into surface contact with the cooling plate 104 disposed below and above the switch 101 to cool the switch 101 by the cooling plate 104, thereby easily releasing heat generated from the switch 101. The remaining switches other than the first switch, the second switch, and the third switch of the plurality of switches 101 and the remaining cooling plates other than the first cooling plate, the second cooling plates, and the third cooling plate of the plurality of cooling plates 104 may also have the foregoing arrangement structure.

The first switching module 100 may include first and second electrode plates 107, 110 that are electrically connected to a plurality of vertically disposed switches 101.

For instance, the first electrode plate 107 may be disposed on a switch located at the top among the plurality of vertically disposed switches 101. For instance, the second electrode plate 110 may be disposed on a switch located at the bottom among the plurality of vertically disposed switches 101.

As described above, the cooling plate 104 may be disposed above and below the switch 101 for cooling the switch 101. Therefore, since the cooling plate 104 is located between the first electrode plate 107 and the switch 101, the first electrode plate 107 may be electrically connected to the switch 101 through a connecting member (not shown), but the present disclosure is not limited thereto. Similarly, since the cooling plate 104 is located between the second electrode plate 110 and the switch 101, the second electrode plate 110 may be electrically connected to the switch 101 through a connecting member (not shown).

The first and second electrode plates may be copper plates made of copper (Cu), but the present disclosure is not limited thereto.

The first electrode plate 107 may be in surface contact with the cooling plate 104 disposed at the top and the second electrode plate 110 may be in surface contact with the cooling plate 104 disposed at the bottom.

The first switching module 100 may include first and second terminals 113, 116 connected to the first and second electrode plates 110, respectively.

The first and second terminals 113, 116 may be made of a metal having excellent electrical conductivity. For instance, the first and second terminals 113, 116 may include copper (Cu) or aluminum (Al).

The first terminal 113 may be electrically connected to the first electrode plate 107. The first terminal 113 may be bent at least once from the first electrode plate 107 and protruded along a lateral direction. For instance, the first terminal 113 may include a first region protruded from the first electrode plate 107 in a lateral direction, a second region extended subsequent to being bent in an upward direction from an end of the first region, and a third region extended from an end of the second region along a lateral direction. The second terminal 116 may be electrically connected to the second electrode plate 110. The second terminal 116 may be bent at least once from the second electrode plate 110 and protruded along a lateral direction. For instance, the first terminal 113 and the second terminal 116 may be protruded in the same direction, but the present disclosure is not limited thereto.

The first and second terminals 113, 116 may be protruded along lateral directions opposite to each other. For instance, the first terminal 113 may be protruded along a first lateral direction, for instance, and the second terminal 116 may be protruded along a second lateral direction, for instance, opposite to the first lateral direction.

The first switching module 100 may include first and second supporting members 125, 128 provided to support a plurality of switches 101 and a plurality of cooling plates 104.

The first and second supporting members 125, 128 may have a plate shape. The first and second supporting members 125, 128 may have a rectangular shape when viewed from above.

The first and second supporting members 125, 128 may be made of a material having excellent insulating properties and supporting strength. For instance, the first and second supporting members 125, 128 may be made of stainless steel.

For instance, the first supporting member 125 may be disposed above the top cooling plate among the plurality of cooling plates 104. For instance, the second supporting member 128 may be disposed under the bottom cooling plate among the plurality of cooling plates 104.

A size of each of the first and second supporting members 125, 128 may be larger than that of the cooling plate 104. The size of each of the first and second supporting members 125, 128 is large, and thus the support rods 135, 136, 137, 138, which will be described later, may be spaced apart from the cooling plate 104 and disposed on a side surface of the switch 101 and the cooling plate 104. In other words, fastening of the support rods 135, 136, 137, 138 may be facilitated because the support rods 135, 136, 137, 138 are not disturbed by the cooling plate 104.

The first switching module 100 may include a plurality of support rods 135, 136, 137, 138 disposed between the first supporting member 125 and the second supporting member 128. Although four support rods 135, 136, 137, 138 are illustrated in the drawing, four or fewer or four or more support rods may be provided.

The support rods 135, 136, 137, 138 have a circular shape when viewed from above, but the present disclosure is not limited thereto. The support rods 135, 136, 137, 138 are disposed between the first supporting member 125 and the second supporting member 128 so that one side is fastened to the first supporting member 125 and the other side is connected to the second supporting member 128. The first and second supporting members may be supported by the support rods 135, 136, 137.

The support rods 135, 136, 137, 138 may be made of a material having excellent insulating properties and supporting strength. For instance, the support rods 135, 136, 137, 138 may be made of stainless steel.

The first switching module 100 may include first and second pressing members 131, 134 for pressing a plurality of switches 101 and a plurality of cooling plates 104 in a vertical direction.

The first and second pressing members 131, 134 may have elasticity. For instance, a first pressing member 131 may be pressed in a downward direction by the first supporting member 125. A plurality of switches 101 and a plurality of cooling plates 104 disposed below the first pressing member 131 may also be pressed in a downward direction as the first pressing member 131 is pressed in a downward direction. For instance, a second pressing member 134 may be pressed in an upward direction by the second supporting member 128. A plurality of switches 101 and a plurality of cooling plates 104 disposed above the second pressing member 134 may also be pressed along an upward direction as the second pressing member 134 is pressed in an upward direction.

The first switching module 100 may include a plurality of thyristors and a signal generation unit 140 disposed on a side surface of the plurality of cooling plates 104.

The signal generation unit 140 may include a substrate 141 and a plurality of drive units 143 mounted on the substrate 141. The signal generation unit 140 may further include a signal line 145 electrically connecting the drive unit 143 and each switch 101. The drive unit 143 may generate a gate signal for switching each switch 101 to provide it to the each switch 101 through each signal line 145. Each switch 101 may be switched by the gate signal.

One side of the substrate 141 may be fastened to the first supporting member 125 and the other side thereof may be fastened to the second supporting member 128.

<Second Switching Module 200>

A switch assembly of a reactive power compensation apparatus according to an embodiment may include the second switching module 200. The second switching module 200 may be a reverse switching module in which a current flows from the first electrode plate 107 to the second electrode plate 110 in a downward direction, for instance, but the present disclosure is not limited thereto.

The second switching module 200 may be disposed on the same plane as the first switching module 100. In other words, the second switching module 200 may be mounted on an upper surface of the support module 400. For instance, the first switching module 100 may be disposed on a first region of the support module 400, and the second switching module 200 may be disposed on a second region of the support module 400.

The second switching module 200 may include a plurality of switches 201, a plurality of cooling plates 204, first and second electrode plates 207, 210, first and second terminals 213, 216, first and second supporting members 225, 228, a plurality of support rods 235, 236, 237, 238, first and second pressing members 231, 234 and a signal generation unit 240.

The switch 201 of the second switching module 200 may have the same structure as that of the switch 201 of the first switching module 100. The cooling plate 204 of the second switching module 200 may have the same structure as the cooling plate 104 of the first switching module 100. The first and second electrode plates 207, 210 of the second switching module 200 may have the same structure as the first and second electrode plates 107, 110 of the first switching module 100. The first and second electrode plates 213, 216 of the second switching module 200 may have the same structure as the first and second terminals 113, 116 of the first switching module 100. The first and second supporting members 225, 228 of the second switching module 200 may have the same structure as the first and second supporting members 125, 128 of the first switching module 100. The support rod of the second switch module 200 may have the same structure as the support rod of the first switching module 100. The first and second electrode plates 231, 234 of the second switching module 200 may have the same structure as the first and second pressing members 131, 134 of the first switching module 100. The signal generation unit 240 of the second switching module 200 may have the same structure as the signal generation unit 140 of the first switching module 100. Accordingly, each component of the second switching module 200 may be easily understood from the respective components of the first switching module 100 described in detail above, and thus each component of the second switching module 200 will be briefly described.

A plurality of cooling plates 204 are provided, and a switch 201 may be disposed between the cooling plates 204. In other words, the second switching module 200 may have a second stack structure in which a plurality of cooling plates 204 and a plurality of switches 201 are stacked along a vertical direction with respect to the support module 400.

The cooling plate 204 and the switch 201 may be in surface contact. As described above, the lower surface and the upper surface of the switch 201 may be brought into surface contact with the cooling plate 204 disposed below and above the switch 201 to cool the switch 201 by the cooling plate 204, thereby easily releasing heat generated from the switch 201.

The first electrode plate 207 may be disposed above a switch located at the top of a plurality of vertically disposed switches 201. For instance, the second electrode plate 210 may be disposed on a switch located at the bottom among the plurality of vertically disposed switches 201.

The cooling plate 204 may be located between the first electrode plate 207 and the switch 201.

The first terminal 213 may be electrically connected to the first electrode plate 207, and bent at least once from the first electrode plate 207 and protruded along a lateral direction. The second terminal 216 may be electrically connected to the second electrode plate 210, and bent at least once from the second electrode plate 210 and protruded along a lateral direction. The first and second terminals 213, 216 may be protruded along lateral directions opposite to each other.

The first supporting member 225 is disposed above the top of the plurality of cooling plates 204, and the second supporting member 228 is disposed below the bottom of the plurality of cooling plates 204. Accordingly, a plurality of switches 201 and a plurality of cooling plates 201 disposed between the first supporting member 225 and the second supporting member 228 may be supported by the first supporting member 225 and the second supporting member 228.

A plurality of support rods may be fastened to the first supporting member 225 and the second supporting member 228 to support the first and second supporting members.

The plurality of switches 201 and the plurality of cooling plates 204 disposed between the first and second pressing members 231, 234 may be pressed by the first and second pressing members 231, 234.

The signal generation unit 240 may include a substrate 241 and a plurality of drive units 243 mounted on the substrate 241. The signal generation unit 240 may further include a signal line 245 electrically connecting the drive unit 243 and each switch 201. The signal generation unit 240, as a member for generating a gate signal for switching each switch 201, may be disposed on a side surface of the plurality of switches 201 and the plurality of cooling plates 204 and fastened to the first supporting member 225 and the second supporting member 228.

<Connection Cooling Plate 105>

A switch assembly of a reactive power compensation apparatus according to an embodiment may include a connection cooling plate 105 for connecting a cooling unit of the first switching module 100 and a cooling unit of the second switching module 200.

The connection cooling plate 105 may be made of the same material as that of the cooling unit of the first switching module 100 and the cooling unit of the second switching module 200, but the present disclosure is not limited thereto.

The connection cooling plate 105 is detachable from the cooling unit of the first switching module 100 and the cooling unit of the second switching module 200. In other words, the connection cooling plate 105 may be fastened or unfastened to the cooling unit of the first switching module 100 and the cooling unit of the second switching module 200.

<Connection Electrodes 117, 118>

The switch assembly of the reactive power compensation apparatus according to an embodiment may include first and second connecting electrodes 117, 118.

The first connecting electrode 117 may fasten a first terminal 113 of the first switching module 100 and a first terminal 213 of the second switching module 200. Accordingly, the first terminal 113 of the first switching module 100 and the first terminal 213 of the second switching module 200 may be electrically connected to the first connecting electrode 117.

The second connecting electrode 118 may fasten a second terminal 116 of the first switching module 100 and a second terminal 216 of the second switching module 200. Accordingly, the second terminal 116 of the first switching module 100 and the second terminal 216 of the second switching module 200 may be electrically connected to the second connecting electrode 118.

<First and Second Bus Bars 119, 122>

The switch assembly of the reactive power compensation apparatus according to an embodiment may include first and second bus bars 119, 122.

The first bus bar 119 may be fastened to the first connecting electrode 117. At least one or more first bus bars may be fastened to the first connecting electrode 117. The first bus bar 119 may be bent at least once from the first connecting electrode 117 and protruded in a lateral direction. The second bus bar 122 may be fastened to the second connecting electrode 118. At least one or more second bus bars may be fastened to the second connecting electrode 118. The second bus bar 122 may be bent at least once from the second connecting plate 118 and protruded along a lateral direction.

The first and second bus bars 119, 122 may be protruded along lateral directions opposite to each other.

In the embodiment, the first electrode plates 107, 207, the second electrode plates 110, 210, the first terminals 113, 213, the second terminals 116, 216, the first connecting electrode 117, the second connecting electrode 118, the first bus bar 119, and the second bus bar 122 may be made of a metal material having excellent electrical conductivity. The first electrode plates 107, 207, the second electrode plates 110, 210, the first terminal 117, the second terminal 118, the first bus bar 119, and the second bus bar 122 may be made of the same metal material, but the present disclosure is not limited thereto.

<Snubber Circuits 300, 310, 320, 330>

The switch assembly of the reactive power compensation apparatus according to an embodiment may include snubber circuits 300, 310, 320, 330. The snubber circuit may include a first resistor module 300, a second resistor module 310, a first capacitor module 320, and a second capacitor module 330.

The first resistor module 300 may include a first resistor substrate 301 and a plurality of first resistor devices 303 mounted on the first resistor substrate 301. For instance, the plurality of first resistor devices 303 may be connected in series. The second resistor module 310 may include a second resistor substrate 311 and a plurality of second resistor devices 313 mounted on the second resistor substrate 311. For instance, the plurality of second resistor devices 313 may be connected in series.

The first capacitor module 320 may include a first capacitor substrate 321 and a plurality of first capacitor devices 323 mounted on the first capacitor substrate 321. For instance, the plurality of first capacitor devices 323 may be connected in parallel. The second capacitor module 330 may include a second capacitor substrate 331 and a plurality of second capacitor devices 333 mounted on the second capacitor substrate 331. For instance, the plurality of second capacitor devices 333 may be connected in parallel.

In terms of electric circuit, the first resistor device 303 and the second resistor device 313 are connected in series, and the first and second capacitor devices 303, 313 are connected between the first resistor device 303 and the second resistor device 313. The first and second capacitor devices 321, 333 may are connected in parallel.

In terms of arrangement structure, the first resistor substrate 301 of the first resistor module 300 may be fastened to the first supporting member 125 at one side and fastened to the second supporting member 128 at the other side. The second resistor substrate 311 of the second resistor module 310 may be fastened to the first supporting member 225 at one side and fastened to the second supporting member 228 at the other side. The first capacitor substrate 321 of the first capacitor module 320 may be fastened to the first supporting member 125 at one side and fastened to the second supporting member 128 at the other side. The second capacitor substrate 331 of the second capacitor module 330 may be fastened to the first supporting member 225 at one side and fastened to the second supporting member 228 at the other side. Moreover, the first resistor module 300 may be disposed on one side of the first switching module 100, and the second resistor module 310 may be disposed on one side of the second switching module 200. The first and second capacitor modules 320 may be disposed on the other side of the first switching module 100, and the second capacitor module 330 may be disposed on the other side of the second switching module 200.

In terms of cooling, first branch pipes 381, 383 branched from the first main pipe 380 are connected to the cooling plate 104 of the first switching module 100 and the cooling plate 204 of the second switching module 200. The first connection pipe 411 may be connected between the cooling plate 104 of the first switching module 100 and the resistor device 303 of the first resistor module 300. The second connection pipe 413 may be connected between the cooling plate 204 of the second switching module 200 and the resistor device 313 of the second resistor module 310. The second branch pipes 391, 393 may be connected from the second main pipe 390 to the resistor device 303 of the first resistor module 300 and the resistor device 313 of the second resistor module 310. Accordingly, cooling water is supplied to the cooling plate 104 of the first switching module 100 and the cooling plate 204 of the second switching module 200 through the first main pipe 380 and the first branch pipes 381, 383 to cool the switch 101 of the first switching module 100 and the switch 201 of the second switching module 200, and then discharged through the first and second connection pipes 411, 413, the second branch pipes 391, 393 and the second main pipe 390.

<First and Second Support Plates 360, 370>

The switch assembly of the reactive power compensation apparatus according to an embodiment may include first and second support plates 360, 370 disposed above and below the first and second switching modules 100, 200.

The first and second switching modules 100, 200 may be disposed between the first support plate 360 and the second support plate 370. The first and second switching modules 100, 200 may be supported by the first support plate 360 and the second support plate 370. For instance, an upper side of the first and second switching modules 100, 200 is fastened to the first support plate 360 and a lower side of the first and second switching modules 100, 200 is fastened to the second support plate 370. The second support plate 370 may be fastened to an upper side of the support module 400.

<First and Second Corona Shields 340, 350>

The switch assembly of the reactive power compensation apparatus according to an embodiment may include first and second corona shields 340, 350.

The first and second corona shields 340, 350 may have a ring shape larger than a size of each of the first and second support plates 360, 370. Each of the first and second corona shields 340, 350 may be disposed to surround the first and second support plates 360, 370, and fastened to at least one or more regions of the first and second support plates 360, 370. Since the first and second corona shields 340, 350 are larger than the size of each of the first and second support plates 360, 370, the first and second corona shields 340, 350 may be disposed to be spaced apart in an outward direction from each of the first and second support plates 360, 370. Accordingly, as intermediate connecting members, a plurality of fastening connecting portion may be provided to fasten the first and second corona shields 340, 350 to the first and second support plates 360, 370.

<First and Second Main Pipes 380, 390, First and Second Branch Pipes 381, 383, 391, 393, and First and Second Connecting Pipes 411, 413>

The reactive power compensating apparatus according to an embodiment may include first and second main pipes 380, 390, first and second branch pipes 381, 383, 391, 393, and first and second connecting pipes 411, 413.

The first main pipe 380 may be disposed on one side surface of one of the first and second switching modules 100, 200. The second main pipe 390 may be disposed on the other side surface of one of the first and second switching modules 100, 200.

The first branch pipes 381, 383 may be branched from the first main pipe 380 in both directions and connected to the cooling plates 104, 204 of the first and second switching modules 100, 200, respectively. The second branch pipes 391, 393 may be branched from the second main pipe 390 in both directions and connected to the resistor devices 303, 313 of the first and second resistor modules 300, 310, respectively.

The first connection pipe 411 may be connected between the cooling plate 104 of the first switching module 100 and the resistor device 303 of the first resistor module 300. The second connection pipe 413 may be connected between the cooling plate 204 of the second switching module 200 and the resistor device 313 of the second resistor module 310.

Accordingly, cooling water is supplied to the cooling plate 104 of the first switching module 100 and the cooling plate 204 of the second switching module 200 through the first main pipe 380 and the first branch pipes 381, 383 to cool the switch 101 of the first switching module 100 and the switch 201 of the second switching module 200, and then discharged through the first and second connection pipes 411, 413, the second branch pipes 391, 393 and the second main pipe 390.

For instance, the first and second main pipes 380, 390, the first and second branch pipes 381, 383, 391, 393 and the first and second connection pipes 411, 413 may be made of different materials. For instance, the first and second main pipes 380, 390, the first and second branch pipes 381, 383, 391, 393 may be made of a resin material, and the first and second connection pipes 411, 413 may be made of a copper (Cu) material.

The first and second connection pipes 411, 413 are disposed adjacent to the switches 101, 201 of the first and second switching modules 100, 200. A considerable amount of heat is generated in the switches 101, 201 of the first and second switching modules 100, 200, and thus the first and second connection pipes 411, 413 must be formed of a material having excellent heat resistance. Therefore, the first and second connection pipes 411, 413 are made of copper, and thus not affected by heat generated by the switches 101, 201 of the first and second switching modules 100, 200.

The first and second main pipes 380, 390 and the first and second branch pipes 381, 383, 391, 393 are disposed on an outer surfaces of the first and second switching modules 100, 200, and thus hardly affected by heat generated by the switching of the first and second switching modules 100, 200. Therefore, a resin material which is cheaper than copper may be used for the first and second main pipes 380, 390 and the first and second branch pipes 381, 383, 391, 393.

In the above description, the first switching module 100 may be referred to as a second switching module, and the second switching module 200 may be referred to as a first switching module. The first electrode plate 107, 207 may be referred to as a second electrode plate and the second electrode plate 110, 210 may be referred to as a first electrode plate. The first terminal 113, 213 may be referred to as a second terminal, and referred to as a second terminal 116, 216. The first connecting electrode 117 may be referred to as a second connecting electrode, and the second connecting electrode 118 may be referred to as a first connecting electrode. The first bus bar 119 may be referred to as a second booth bar, and the second bus bar 122 may be referred to as a first booth bar. The first supporting member 125, 225, 360 may be referred to as a second supporting member, and the second supporting member 128, 228, 370 may be referred to as a first supporting member. The first pressing member 131, 231 may be referred to as a second pressing member, and the second pressing member 134, 234 may be referred to as a first pressing member. The first resistor module 300 may be referred to as a second resistor module, and the second resistor module 313 may be referred to as a first resistor module. The first main pipe 380 may be referred to as a second main pipe, and the second main pipe 390 may be referred to as a first main pipe. The first connection pipe 411 may be referred to as a second connection pipe, and the second connection pipe 413 may be referred to as a first connection pipe.

Hereinafter, a method of replacing a switch in a switching module will be described.

FIGS. 6 through 11 illustrate a method of replacing a switch in a first switching module according to an embodiment.

Though a method of replacing a switch in a first switching module 100 is illustrated in FIGS. 6 through 11, the first switching module 100 and the second switching module 200 have the same switch replacement method. Therefore, the description of the switch replacement method in the second switching module 200 will be omitted and easily understood from FIGS. 6 through 11.

Figure 6:
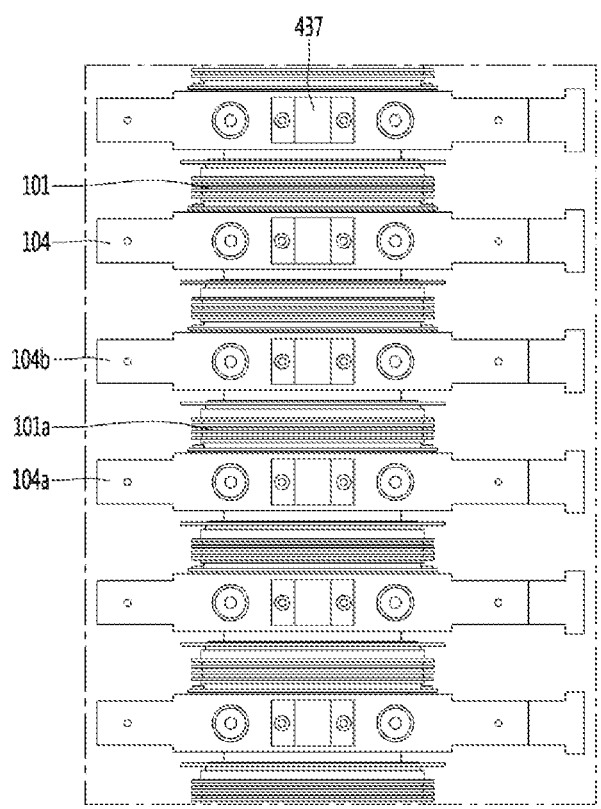
FIGS. 6 through 11 illustrate a method of replacing a switch in a first switching module according to an embodiment.

As illustrated in FIG. 6, when a specific switch 101a is damaged among a plurality of switches 101 disposed between a plurality of cooling plates 104, the specific switch 101a must be replaced.

According to an embodiment, the damaged specific switch 101a may be quickly and easily replaced. In order to replace the specific switch 101a, it is not required to remove all components located above the specific switch 101a, for instance, the plurality of switches 101, the plurality of cooling plates 104, the first pressing member 131, the first supporting member 125, and the plurality of support rods 135, 136, 137, 138. In other words, the second cooling plate 104b may be separated from the specific switch 101a by separating between adjacent cooling plates 104a, 104b (hereinafter, referred to as first and second cooling plates) disposed above/below the damaged specific switch 101a, and then the relevant specific switch 101a may be removed to insert a new switch.

Figure 7:
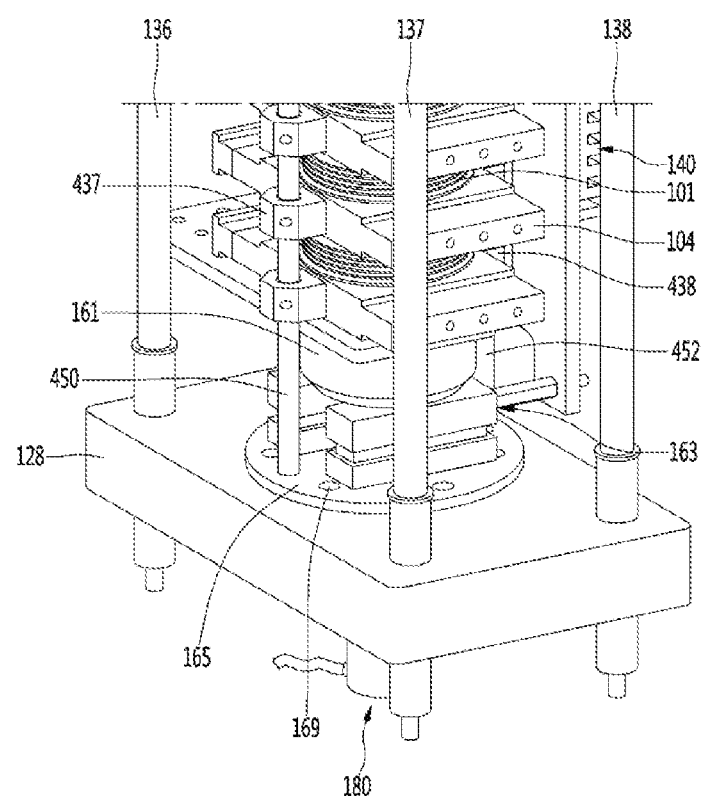
Figure 8:
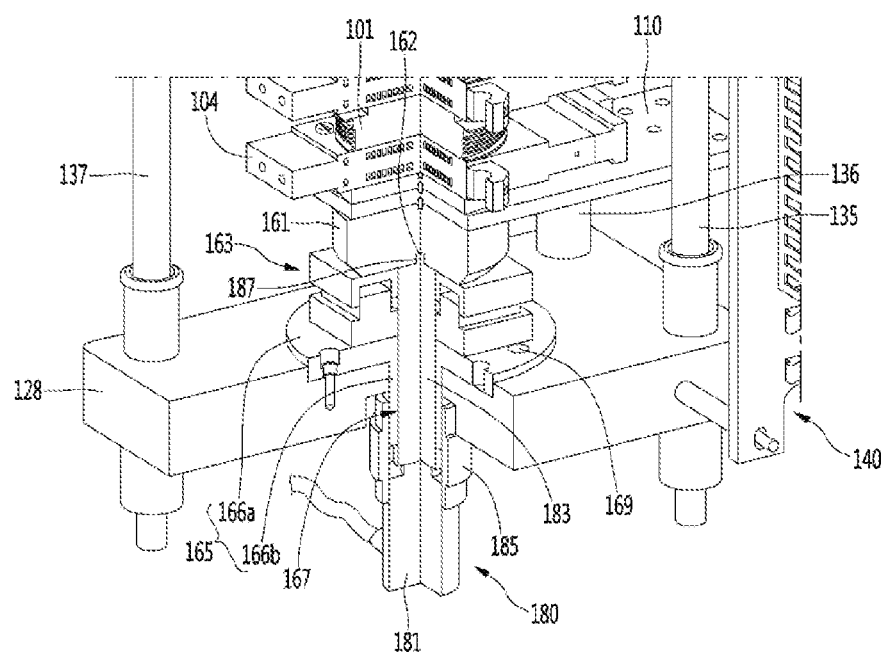

FIG. 7 is a perspective view illustrating a lower side of the first switching module according to an embodiment, and FIG. 8 is a partial cutaway view illustrating a lower side of the first switching module according to an embodiment.

As illustrated in FIGS. 7 and 8, the first pressing device 180 may be fixed to a lower side of the first switching module 100.

Specifically, at least two or more guide rods 450, 452 may be fixed to the insertion guide portion 165 through holes (not shown) formed in the protruding portions 437, 438 of the cooling plates 104, respectively. The alignment of the plurality of cooling plates 104 may be maintained even when pressing applied between the first supporting member 125 and the second supporting member 128 is released due to the support of the guide rods 450, 452.

The pressure transmission portion 183 of the first pressing device 180 may be inserted through the insertion hole 167 of the insertion guide portion 165 and fixed to the first pressing support portion 161 through the second pressing support portion 163. The protruding portion 187 of the pressure transmission portion 183 of the first pressing device 180 may be inserted into the insertion groove 162 of the first pressing support portion 161. Moreover, the vertical portion 166b of the insertion guide portion 165 may be inserted into a groove between the fastening portion 185 and the pressure transmission portion 183 of the first pressure device 180. Accordingly, the first pressing device 180 may be fixed to the first switching module 100.

The second pressing member 134 may be disposed between the second electrode plate and the second supporting member 128. The second pressing member 134 may include a first pressing support portion 161 and a second pressing support portion 163. The insertion guide portion 165 may be included in the second pressing member 134 or may not be included in the second pressing member 134 but may exist as a separate component.

The first pressing support portion 161 may be disposed between the second electrode plate 110 and the second supporting member 128. The second pressing support portion 163 may be disposed between the first pressing support portion 161 and the insertion guide portion 165. The insertion guide portion 165 may be disposed between the second pressing support portion 163 and the second supporting member 128.

The insertion guide portion 165 may guide the insertion of the first pressing device 180 to press the first pressing support portion by the first pressing device 180.

The insertion guide portion 165 may include a horizontal portion 166a disposed on the second supporting member 128 and a vertical portion 166b extended through the second supporting member 128 from the horizontal portion. The horizontal portion may be brought into surface contact with the second pressing support portion 163. The vertical portion 166b may include an insertion hole 167 into which the first pressing device 180, specifically, the pressure transmission portion 183 of the first pressure device 180, is inserted. The pressure transmission portion 183 of the first pressing device 180 is inserted through the insertion hole 167 of the insertion guide portion 165 to transmit the pressing of the pressure transmission portion 183 to the first pressing support portion 161.

The first pressing device 180 may include a cylinder. For the cylinder, a hydraulic cylinder may be used, but the present disclosure is not limited thereto.

The first pressure device 180 may include a pressure supply portion 181 for supplying pressure generated by the pump, that is, hydraulic pressure, and a pressure transmission portion 183 for transmitting the generated pressure. The first pressure device 180 may further include a fastening portion 185 for fastening the pressure supply portion 181 to the pressure transmission portion 183.

The first pressing support portion 161 may be pressed and raised along an upward direction by pressure transmitted by the pressure transmission portion 183 of the first pressing device 180. Accordingly, the first pressing support portion 161 and the second supporting member 128 may be spaced apart from each other by at least a thickness larger than that of the second pressing support portion 163. In other words, the first pressing support portion 161 may be spaced in an upward direction from an upper surface of the second pressing support portion 163, thereby easily removing the second pressing support portion 163.

Figure 9:
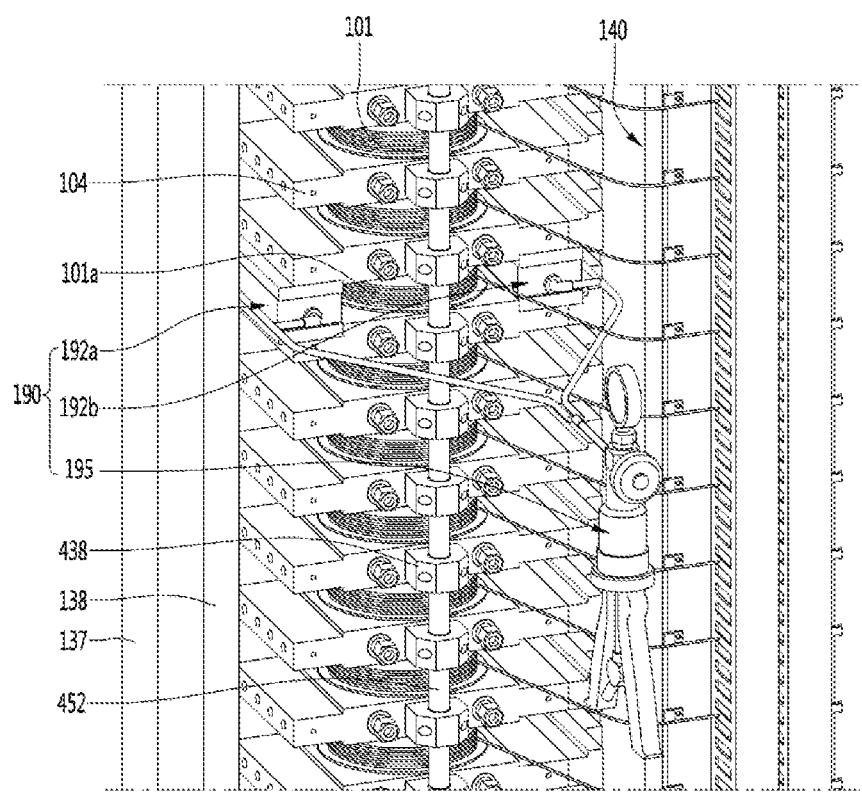
Figure 10:
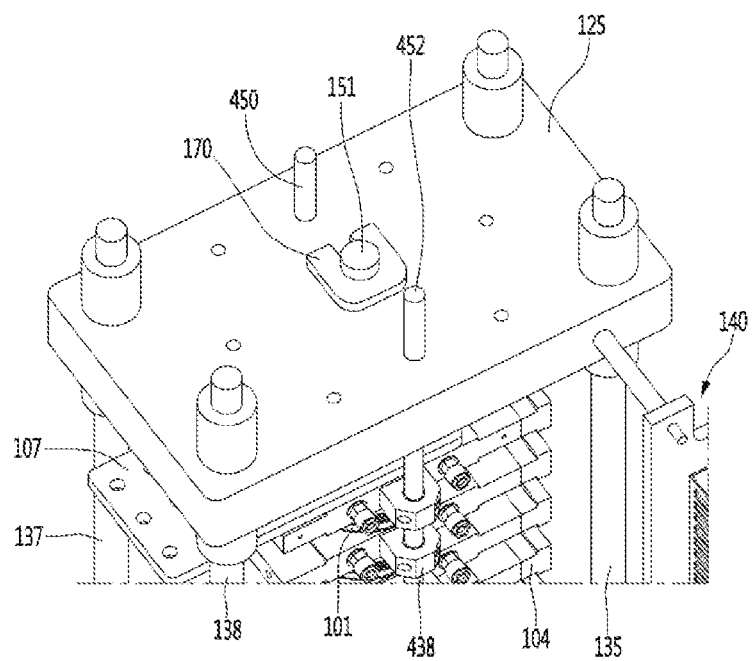
Figure 11:
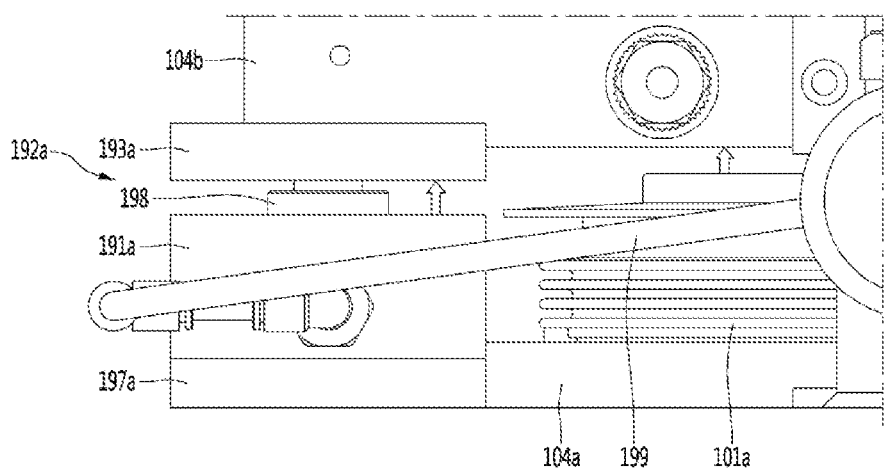

As illustrated in FIGS. 9 through 11, the first pressing portion 192a and the second pressing portion 192b of the second pressing device 190 may be disposed around the specific switch 101a. For instance, the first pressing portion 192a may be disposed between the first cooling plate 104a and the second cooling plate 104b on a first side of the specific switch 101a. For instance, the second pressing portion 192b may be disposed between the first cooling plate 104a and the second cooling plate 104b on a second side of the specific switch 101a. Here, the first side may be located on an opposite side to the second side.

Figure 12:
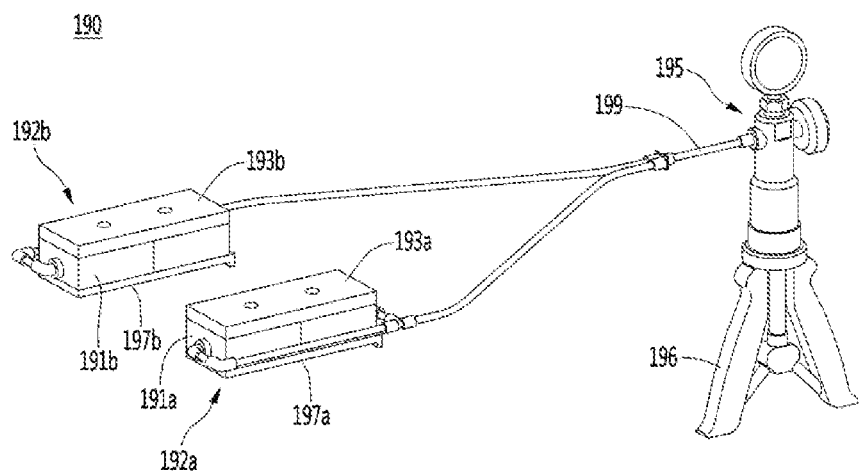
FIGS. 12 and 13 illustrate a pressing device according to an embodiment.
Figure 13:
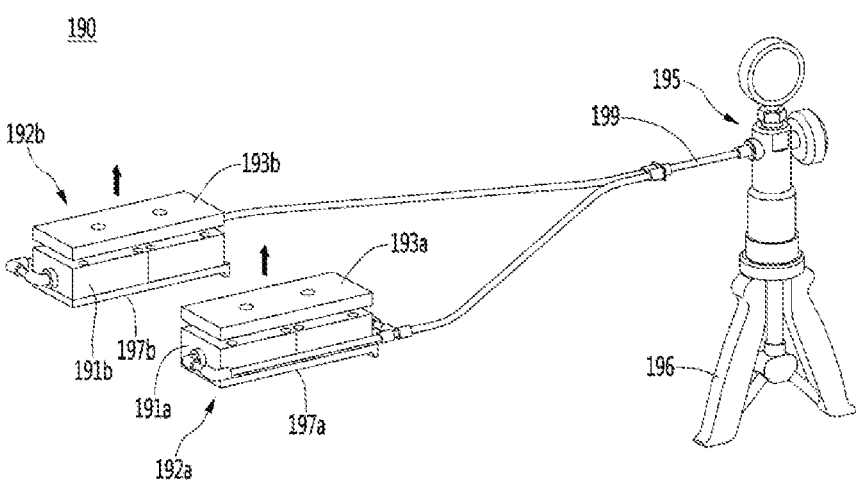

FIGS. 12 and 13 illustrate a pressing device according to an embodiment. Specifically, FIG. 12 illustrates a state prior to the pressure transmission portion being moved in an upward direction in the pressing device according to an embodiment, and FIG. 13 illustrates a state of the pressure transmission portion being moved in an upward direction in the pressing device according to an embodiment.

As illustrated in FIGS. 11 and 12, the second pressing device 190 may include first and second pressing portions 192a, 192b, respectively, provided with pressure supply portions 191a, 191b, a pressure drive portion 198, pressure transmission portions 193a, 193b, and support plates 197a, 197b.

The pressure supply portions 191a, 191b may supply pressure to the pressure drive portion 198.

The pressure drive portion 198 may be disposed on the pressure supply portions 191a, 191b and moved up and down by the supplied pressure. When pressure is supplied to the pressure drive portion 198, the pressure drive portion 198 may be moved in an upward direction. When pressure is not supplied to the pressure drive portion 198, the pressure drive portion 198 may be moved in a downward direction and returned.

As illustrated in FIG. 13, the pressure transmission portions 193a, 193b may be disposed on the pressure drive portion 198, and moved up and down in accordance with the upward and downward movement of the pressure drive portion 198. When the first and second pressing portions 192a, 192b of the second pressing device 190 are disposed between the first cooling plate 104a and the second cooling plate 104b, an upper surface of the pressure transmission portions 193a, 193b of the first and second pressing portions 192a, 192b, respectively, may be brought into contact with a lower surface of the second cooling plate 104b. In this case, for instance, when the pressure drive portion 198 is moved in an upward direction, the pressure transmission portions 193a, 193b may also be moved in an upward direction to move the second cooling plate 104b in contact with the pressure transmission portions 193a, 193b in an upward direction.

The support plates 197a, 197b may be disposed below the pressure supply portions 191a, 191b. The support plates 197a, 197b may support the first and second pressing portions 192a, 192b, respectively.

A lower surfaces of the support plates 197a, 197b and an upper surfaces of the pressure transmission portions 193a, 193b may have a flat surface. A lower surfaces of the support plates 197a, 197b may be brought into surface contact with an upper surface of the first cooling plate 104a, and an upper surfaces of the pressure transmission portions 193a, 193b may be brought into surface contact with a lower surface of the second cooling plate 104b.

On the other hand, the second pressing device 190 may further include a pressure generation portion 195 connected to the first and second pressing device 192a, 192b to generate pressure. Pressure generated from the pressure generation portion 195 may be transmitted to the pressure supply portions 191a, 191b of the first and second pressing portions 192a, 192b, respectively.

The pressure generation portion 195 may include a knob 196. The knob 196 may be manipulated by an operator. In other words, the operator may repeat the operation of holding the knob 196 firmly and releasing it, thereby generating pressure from the pressure generation portion 195.

The pressure generation portion 195 is a high-performance hand pump, and even when a pressure of about 6 to 7 bar is generated from the pressure generation portion 195, the pressure transmission portions 193a, 193b of the first and second pressing portions 192a, 192b, respectively, may be moved at least 10 mm or more in an upward direction.

Prior to the second cooling plate 104b being pressed by the first and second pressing portions 192a, 192b of the second pressing device 190, a protruding region 151 of the pressing member 131 may be fixed by a clamp, as illustrated in FIG. 10.

The protruding region 151 of the first pressing member 131 may be disposed between the uppermost cooling plate 104 and the first supporting member 125 and protruded through the first supporting member 125. As described above, as the first pressing support portion 161 is moved in an upward direction by the first pressing device 180, the protruding region 151 of the first pressing member 131 may be further moved in an upward direction from an upper surface of the first supporting member 125. The protruding region 151 of the first pressing member 131 moved in an upward direction as described above may fixed by the clamp 170, thereby preventing the protruding region 151 of the first pressing member 131 from moving in a downward direction.

As illustrated in FIG. 11, the second cooling plate 104b may be pressed by the first and second pressing portions 192a, 192b of the second pressing device 190, thereby moving the second cooling plate 104b in contact with the pressure transmission portions 193a, 193b of the first and second pressing portions 192a, 192b, respectively, in an upward direction. Accordingly, a lower surface of the second cooling plate 104b may be spaced apart along an upper direction from an upper surface of the specific switch 101a, thereby easily removing the specific switch 101a since nothing is disturbed by the removal of the specific switch 101a. For instance, in brief, the specific switch 101a may be moved and removed in a first lateral direction in a sliding movement manner on an upper surface of the first cooling plate 104a. Instead, a new switch may be moved in a second lateral direction opposite to the first lateral direction in a sliding movement manner on an upper surface of the first cooling plate 104a and inserted between the first cooling plate 104a and the second cooling plate 104b.

The subsequent assembly process may be carried out in a reverse order to the foregoing description.

In other words, pressing by the first and second pressing portions 192a, 192b of the second pressing device 190 may be released, thereby moving the second cooling plate 104b in a downward direction to place a lower surface of the second cooling plate 104b on an upper surface of the new switch.

The clamp 170 may be removed to release the fixation of the protruding region 151 of the first supporting member 125, thereby moving the first support member 125 in a downward direction.

The first pressing support portion 161 on a lower side of the first switching module 100 may be moved in an upward direction using the first pressing device 180, thereby separating the first pressing support portion 161 from the second supporting member 128. The second pressing support portion 163 may be inserted into the separated space, that is, between the first pressing support portion 161 and the second supporting member 128.

The pressing of the first pressing device 180 may be released, thereby pressing the second pressing support portion 163 by the weight of the first pressing support portion 161.

At least two or more guide rods 450, 452 that have passed through the protruding portions 437, 438 of each cooling plates 104 may be removed.

The detailed description thereof should not be construed as restrictive in all aspects but considered as illustrative. The scope of the embodiment should be determined by reasonable interpretation of the appended claims and all changes that come within the equivalent scope of the embodiment are included in the scope of the embodiment.

What is the claimed is:

1. A method of replacing a switch in a switching module comprising a plurality of cooling plates stacked along a vertical direction; a switch disposed between the cooling plates; a first supporting member disposed above the uppermost cooling plate; a second supporting member disposed below the lowermost cooling plate; first and second pressing support portions disposed between the lowermost cooling plate and the second supporting member, and a pressing member comprising a protruding region disposed between the uppermost cooling plate and the first supporting member and protruded on the first supporting member through the first supporting member, the method comprising:
    allowing at least two or more guide rods to pass through each of the cooling plates to fix the plurality of cooling plates;
    pressing the first pressing support portion using a first pressing device to raise the first pressing support portion in an upward direction;
    removing the second pressing support portion;
    arranging a second pressing device around a specific switch disposed between a first cooling plate and a second cooling plate on the first cooling plate among the plurality of cooling plates;
    pressing the second cooling plate using the second pressing device to separate the second cooling plate from the specific switch;
    fixing the protruding region of the pressing member using a clamp; and
    removing the specific switch and inserting a new switch.

2. The method of claim 1, wherein said raising the first pressing support portion comprises fixing the first pressing device to the first pressing support portion through the first supporting member and the second pressing support portion.

3. The method of claim 2, wherein the second pressing device comprises a first pressing portion and a second pressing portion, and the first pressing portion is disposed between the first cooling plate and the second cooling plate on a first side of the specific switch, and the second pressing portion is disposed between the first cooling plate and the second cooling plate on a second side of the specific switch.

4. The method of claim 1, further comprising:
    removing pressure applied to the second cooling plate using the second pressing device when the new switch is inserted; removing the clamp from the protruding region; raising the first pressing support portion in an upward direction using the first pressing device; inserting the second pressing support portion between the first pressing support portion and the first supporting member; and removing the guide rods.

* * * * *